United States Patent
Rubinsztain et al.

(10) Patent No.: US 11,848,682 B2
(45) Date of Patent: Dec. 19, 2023

(54) DIAGNOSTIC CIRCUITS AND METHODS FOR ANALOG-TO-DIGITAL CONVERTERS

(71) Applicant: Allegro MicroSystems, LLC, Manchester, NH (US)

(72) Inventors: Ezequiel Rubinsztain, Buenos Aires (AR); Pablo Javier Bolsinger, Buenos Aires (AR); Juan Manuel Cesaretti, Ciudad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/647,639

(22) Filed: Jan. 11, 2022

(65) Prior Publication Data

US 2023/0223949 A1   Jul. 13, 2023

(51) Int. Cl.
*H03M 1/10*   (2006.01)
*H03M 1/18*   (2006.01)
*H03M 1/12*   (2006.01)
*H03M 1/06*   (2006.01)

(52) U.S. Cl.
CPC ......... *H03M 1/188* (2013.01); *H03M 1/1245* (2013.01); *H03M 1/181* (2013.01); *H03M 1/0621* (2013.01)

(58) Field of Classification Search
CPC ..... H03M 1/118; H03M 1/1245; H03M 1/181
USPC ................................. 341/118, 120, 155, 144
See application file for complete search history.

(56) References Cited

U.S. PATENT DOCUMENTS

| | | |
|---|---|---|
| 3,398,366 A | 8/1968 | Apfelbeck |
| 4,004,217 A | 1/1977 | Giffard |
| 5,729,476 A | 3/1998 | Pfau |
| 5,793,778 A | 8/1998 | Qureshi |
| 5,854,598 A | 12/1998 | De Vries et al. |
| 5,917,320 A | 6/1999 | Scheller et al. |

(Continued)

FOREIGN PATENT DOCUMENTS

| | | |
|---|---|---|
| CN | 107437942 | 12/2017 |
| DE | 42 27 113 A1 | 2/1994 |

(Continued)

OTHER PUBLICATIONS

U.S. Appl. No. 17/501,120, filed Oct. 14, 2021, Lutz.

(Continued)

*Primary Examiner* — Peguy Jean Pierre
(74) *Attorney, Agent, or Firm* — DALY, CROWLEY, MOFFORD & DURKEE, LLP

(57) ABSTRACT

Apparatus includes an ADC configured to convert an analog signal to a digital signal, a comparator having a first input responsive to the analog signal, a second input responsive to the digital signal, and an output at which a comparison signal is provided, and an output checker configured to process the comparison signal to generate a fault signal indicative of whether a fault has occurred in the ADC. The comparator can be an analog comparator in which case the digital signal is converted to an analog signal for the comparison or a digital comparator in which case an additional ADC is provided to convert the analog signal into a digital signal for the comparison. Embodiments include more than one ADC in which case summation elements are provided to sum the analog signals and the digital signals for the comparison.

25 Claims, 7 Drawing Sheets

(56) References Cited

U.S. PATENT DOCUMENTS

| | | | |
|---|---|---|---|
| 6,091,239 | A | 7/2000 | Vig et al. |
| 6,191,608 | B1 | 2/2001 | Cliff et al. |
| 6,191,698 | B1 | 2/2001 | Hennig et al. |
| 6,211,803 | B1* | 4/2001 | Sunter .............. H03M 1/109 341/120 |
| 6,288,567 | B1 | 9/2001 | Fink |
| 6,297,627 | B1 | 10/2001 | Towne et al. |
| 6,420,868 | B1 | 7/2002 | Ganther, Jr. et al. |
| 6,542,847 | B1 | 4/2003 | Lohberg et al. |
| 6,545,495 | B2 | 4/2003 | Warmack et al. |
| 6,557,131 | B1 | 4/2003 | Arabi |
| 6,687,644 | B1 | 2/2004 | Zinke et al. |
| 6,693,419 | B2 | 2/2004 | Stauth et al. |
| 6,815,944 | B2 | 11/2004 | Vig et al. |
| 6,873,272 | B2 | 3/2005 | Pezzini |
| 6,968,484 | B2 | 11/2005 | Hummel |
| 6,980,005 | B2 | 12/2005 | Finlay, Sr. et al. |
| 7,026,808 | B2 | 4/2006 | Vig et al. |
| 7,096,386 | B2 | 8/2006 | Ozawa |
| 7,184,876 | B2 | 2/2007 | Teulings et al. |
| 7,199,579 | B2 | 4/2007 | Scheller et al. |
| 7,319,418 | B2 | 1/2008 | Fink |
| 7,327,153 | B2 | 2/2008 | Weinraub |
| 7,466,123 | B2 | 12/2008 | Kato et al. |
| 7,694,200 | B2 | 4/2010 | Forrest et al. |
| 7,800,389 | B2 | 9/2010 | Friedrich et al. |
| 8,299,783 | B2 | 10/2012 | Fernandez et al. |
| 8,319,509 | B1 | 11/2012 | Staver et al. |
| 8,624,588 | B2 | 1/2014 | Vig et al. |
| 9,383,425 | B2 | 7/2016 | Milano et al. |
| 9,698,809 | B1 | 7/2017 | Mallett |
| 9,804,222 | B2 | 10/2017 | Petrie et al. |
| 9,851,416 | B2 | 12/2017 | Scheller et al. |
| 9,910,088 | B2 | 3/2018 | Milano et al. |
| 10,216,559 | B2 | 2/2019 | Fernandez |
| 10,380,879 | B2 | 8/2019 | Haas et al. |
| 10,551,439 | B2 | 2/2020 | Drouin et al. |
| 10,580,289 | B2 | 3/2020 | Haas et al. |
| 10,613,158 | B2 | 4/2020 | Cook et al. |
| 10,636,285 | B2 | 4/2020 | Haas et al. |
| 10,692,362 | B2 | 6/2020 | Petrie et al. |
| 10,782,363 | B2 | 9/2020 | Scheller et al. |
| 10,948,537 | B2 | 3/2021 | Forrest et al. |
| 11,143,732 | B2 | 10/2021 | Romero et al. |
| 11,194,004 | B2 | 12/2021 | Scheller et al. |
| 2001/0002791 | A1 | 6/2001 | Tsuge et al. |
| 2002/0017926 | A1 | 2/2002 | Saito |
| 2002/0109501 | A1 | 8/2002 | Schroeder |
| 2002/0196052 | A1 | 12/2002 | Furuya |
| 2003/0227400 | A1 | 12/2003 | Giddens et al. |
| 2004/0059959 | A1 | 3/2004 | Ozawa |
| 2005/0038623 | A1 | 2/2005 | Hammerschmidt |
| 2006/0208729 | A1 | 9/2006 | Forrest et al. |
| 2007/0188245 | A1 | 8/2007 | Kraemer et al. |
| 2008/0133158 | A1 | 6/2008 | Koo |
| 2008/0303468 | A1 | 12/2008 | Muller |
| 2010/0026279 | A1 | 2/2010 | Vig et al. |
| 2010/0103006 | A1 | 4/2010 | Miyake et al. |
| 2010/0241302 | A1 | 9/2010 | Shimizu |
| 2011/0290036 | A1 | 12/2011 | Pflum |
| 2011/0298448 | A1 | 12/2011 | Foletto et al. |
| 2011/0298449 | A1 | 12/2011 | Foletto et al. |
| 2012/0025817 | A1 | 2/2012 | Romero et al. |
| 2012/0256774 | A1* | 10/2012 | Dey ................... H03M 1/109 341/172 |
| 2012/0274563 | A1 | 11/2012 | Olsson |
| 2013/0265036 | A1 | 10/2013 | Friedrich et al. |
| 2013/0320970 | A1 | 12/2013 | Foletto et al. |
| 2013/0335069 | A1 | 12/2013 | Vig et al. |
| 2014/0009144 | A1 | 1/2014 | Romero |
| 2014/0062358 | A1 | 3/2014 | Reynolds et al. |
| 2014/0084903 | A1 | 3/2014 | Vig et al. |
| 2014/0084904 | A1 | 3/2014 | Vig et al. |
| 2014/0143624 | A1* | 5/2014 | Deng ................. H03M 1/109 714/734 |
| 2016/0123780 | A1 | 5/2016 | Snyder et al. |
| 2016/0252599 | A1* | 9/2016 | Motz ................. G01R 33/075 324/251 |
| 2017/0187385 | A1 | 6/2017 | Schweitzer, III et al. |
| 2020/0379061 | A1 | 12/2020 | Scheller et al. |

FOREIGN PATENT DOCUMENTS

| | | |
|---|---|---|
| DE | 44 05 801 A1 | 8/1995 |
| DE | 44 444 08 A1 | 6/1996 |
| DE | 10 2004 006268 A1 | 9/2004 |
| DE | 11 2008 001 889 T5 | 5/2010 |
| EP | 1 580 561 A1 | 9/2005 |
| EP | 1 662 353 A1 | 5/2006 |
| ES | 2372773 | 1/2012 |
| GB | 2034547 | 6/1980 |
| JP | S63-185555 A | 8/1988 |
| JP | 02-271256 | 11/1990 |
| JP | 03-096809 | 4/1991 |
| JP | 05-014196 | 1/1993 |
| JP | 06-300584 | 10/1994 |
| JP | 07-066649 | 3/1995 |
| JP | 09-079004 | 3/1997 |
| JP | H10-504436 A | 4/1998 |
| JP | 2003-195933 | 7/2003 |
| JP | 2006-098140 A | 4/2006 |
| JP | 2014090362 * | 5/2014 .............. H03M 1/46 |
| KR | 2002-0013800 A | 2/2002 |
| TW | 441192 | 6/2001 |
| WO | WO 2006/056829 A1 | 6/2006 |
| WO | WO 2013/180852 A1 | 12/2013 |
| WO | WO 2013/191891 | 12/2013 |
| WO | WO 2016/069216 A2 | 5/2016 |

OTHER PUBLICATIONS

U.S. Non-Final Office Action dated Jul. 21, 2009 for U.S. Appl. No. 11/779,354; 8 pages.

Response to U.S. Non-Final Office Action dated Jul. 21, 2009 for U.S. Appl. No. 11/779,354; Response filed Oct. 19, 2009; 15 pages.

Notice of Allowance dated Dec. 17, 2009; for U.S. Appl. No. 11/779,354; 5 pages.

PCT International Search Report and Written Opinion of the dated Sep. 19, 2008 for International Application No. PCT/US2008/067060; 15 pages.

PCT International Preliminary Report dated Jan. 19, 2010 for International Application No. PCT/US2008/067060; 10 pages.

English Translation of German Office Action dated May 10, 2017 for German Application No. 112008001889.8; 6 pages.

Response (with Machine English Translation and Amended Claims) to German Office Action dated May 10, 2017 for German Application No. 112008001889.8; Response filed Sep. 15, 2017; 15 Pages.

German Office Action with English translation dated Feb. 3, 2021 for German Application No. 11 2008 001 889.8; 15 pages.

Response (with English Translation) to Office Action dated Feb. 3, 2021 for German Application No. 112008001889.8; Response filed on Jun. 9, 2021; 37 Pages.

Japanese Office Action (English Translation only) dated Aug. 29, 2012 for Japanese Application No. 2010-517046; 3 Pages.

Response (with English Claims) to Japanese Office Action dated Aug. 29, 2012 for Japanese Application No. 2010-517046; Response filed on Nov. 28, 2012; 13 Pages.

Japanese Office Action (English Translation only) dated Jan. 4, 2013 for Japanese Application No. 2010-517046; 2 Pages.

Response filed Apr. 19, 2013 (with English Claims) and Demand of Appeal to the Office Action dated Jan. 4, 2013 for Japanese Application No. 2010-517046; 12 Pages.

Japanese Notice of Allowance dated May 24, 2013 for Japanese Application No. 2010-517046; 4 Pages.

Japanese Office Action (with English Translation) dated Sep. 9, 2013 for Japanese Application No. 2013-088148; 4 Pages.

Response (with English Translation) to Japanese Office Action dated Sep. 9, 2013 for Japanese Application No. 2013-088148; Response filed on Oct. 15, 2013; 8 Pages.

(56) References Cited

OTHER PUBLICATIONS

Japanese Notice of Allowance (with English Translation) dated Nov. 8, 2013 for Japanese Application No. 2013-088148; 6 Pages.
U.S. Non-Final Office Action dated Jan. 13, 2017 for U.S. Appl. No. 14/337,613; 27 pages.
Response to U.S. Non-Final Office Action dated Jan. 13, 2017 for U.S. Appl. No. 14/337,613; Response Filed on Apr. 12, 2017; 12 Pages.
U.S. Final Office Action dated Jul. 21, 2017 for U.S. Appl. No. 14/337,613; 29 pages.
Response to U.S. Final Office Action dated Jul. 21, 2017 for U.S. Appl. No. 14/337,613; Response filed Aug. 14, 2017; 10 pages.
Notice of Allowance dated Aug. 25, 2017 for U.S. Appl. No. 14/337,613; 10 pages.
PCT Invitation to pay additional fees with partial search report dated Dec. 7, 2015 for International Application No. PCT/US2015/037098; 9 pages.
PCT International Search Report and Written Opinion dated Apr. 11, 2016 for International Application No. PCT/US2015/037098; 25 pages.
PCT International Preliminary Report dated Feb. 2, 2017 for International Application No. PCT/US2015/037098; 16 Pages.
European Communication pursuant to Rules 161 (1) and 162 EPC dated Mar. 1, 2017; for European Application No. 15736878.8; 2 pages.
Response to European Office Action dated Mar. 1, 2017 for European Application No. 15736878.8; Response filed on Sep. 7, 2017; 12 pages.
European Communication Pursuant to Article 94(3) EPC dated Jun. 13, 2018 for European Application No. EP 15736878.8; 6 pages.
European Response filed Aug. 22, 2018 for European Application No. 15736878.8; 17 pages.
European Intention to Grant dated Jan. 7, 2020 for European Application No. 15736878.8; 7 Pages.
Korean Office Action (with Machine English Translation) dated Jan. 20, 2020 for Korean Application No. 10-2017-7002973; 13 Pages.
Response (with English Translation) to Korean Office Action dated Jan. 20, 2020 for Korean Application No. 10-2017-7002973; Response filed Feb. 24, 2020; 30 Pages.
Korean Notice of Allowance (with English Translation & Allowed Claims) dated Jun. 22, 2020 for Korean Application No. 10-2017-7002973; 10 Pages.
U.S. Restriction Requirement dated Dec. 18, 2019 for U.S. Appl. No. 15/816,045; 7 Pages.
Response to U.S. Restriction Requirement dated Dec. 18, 2019 for U.S. Appl. No. 15/816,045; Response Filed Dec. 18, 2019; 1 Page.
U.S. Non-Final Office Action dated Feb. 4, 2020 for U.S. Appl. No. 15/816,045; 18 Pages.
Response to U.S. Non-Final Office Action dated Feb. 4, 2020 for U.S. Appl. No. 15/816,045; Response Filed Apr. 10, 2020; 12 Pages.
U.S. Notice of Allowance dated Aug. 5, 2020 for U.S. Appl. No. 15/816,045; 22 Pages.
U.S. Final Office Action dated Jun. 2, 2017 for U.S. Appl. No. 14/529,497; 21 pages.
Response to U.S. Final Office Action dated Jun. 2, 2017 for U.S. Appl. No. 14/529,497; Response filed Aug. 14, 2017; 25 pages.
U.S. Non-Final Office Action dated Nov. 14, 2016 for U.S. Appl. No. 14/529,497; 15 pages.
Response to U.S. Non-Final Office Action dated Nov. 14, 2016 for U.S. Appl. No. 14/529,497; Response filed Feb. 14, 2017; 25 pages.
U.S. Non-Final Office Action dated Dec. 12, 2017 for U.S. Appl. No. 14/529,497; 35 pages.
Response to U.S. Non-Final Office Action dated Dec. 12, 2017 for U.S. Appl. No. 14/529,497; Response filed on Feb. 12, 2018; 18 Pages.
U.S. Final Office Action dated Jun. 26, 2018 for U.S. Appl. No. 14/529,497; 36 pages.
Response dated Sep. 20, 2018 to Final Office Action dated Jun. 26, 2018 for U.S. Appl. No. 14/529,497; 16 Pages.
Notice of Allowance dated Oct. 4, 2018, for U.S. Appl. No. 14/529,497; 8 Pages.
PCT Invitation to pay additional fees and Partial Search Report dated Feb. 5, 2016 for International Application No. PCT/US2015/054172; 8 pages.
PCT International Preliminary Report on Patentability dated May 11, 2017 for International Application No. PCT/US2015/054172; 14 pages.
PCT International Search Report and Written Opinion dated Apr. 21, 2017 for International Application No. PCT/US2015/054172; 23 pages.
European Rules 161/162 Communication dated Jun. 2, 2017 for European Application No. 15784210.5; 2 Pages.
European Response to Communication dated Nov. 29, 2017 for European Application No. 15784210.5; 19 pages.
Notice of Allowance dated Jun. 24, 2019 for European Application No. 15784210.5; 7 Pages.
Response to Non-Final Office Action dated Oct. 13, 2022 for U.S. Appl. No. 16/994,864; Response filed Dec. 6, 2022; 10 Pages.
U.S. Notice of Allowance dated Dec. 29, 2022 for U.S. Appl. No. 16/994,864; 14 Pages.
U.S. Non-Final Office Action dated Oct. 13, 2022 for U.S. Appl. No. 16/994,864; 16 Pages.
Kester et al. "Testing Data Converter" Chapter 5, Section 5-1, Dec. 18, 2004, 76 pages.
Partial European Search Report dated Jun. 12, 2023 for European Application No. EP22205937.0; 13 pages.
Taiwan Office Action with English translation dated Aug. 9, 2023 for Taiwanese Application No. 111143206, 11 pages.
Extended European Search Report dated Sep. 14, 2023 for European Application No. EP22205937.0; 19 pages.

* cited by examiner

DIAGNOSTIC CIRCUITS AND METHODS FOR ANALOG-TO-DIGITAL CONVERTERS

CROSS-REFERENCE TO RELATED APPLICATIONS

Not Applicable.

STATEMENT REGARDING FEDERALLY SPONSORED RESEARCH

Not Applicable.

FIELD

This disclosure relates generally to analog-to-digital converters (ADCs) and, more particularly, to diagnostic circuits and methods for ADCs.

BACKGROUND

As is known, sensors are used to perform various functions in a variety of applications. Some sensors include one or magnetic field sensing elements, such as a Hall effect element or a magnetoresistive element, to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, a current sensor that senses a magnetic field generated by a current flowing in a current conductor, and an angle sensor that senses an angle of a magnetic field. Magnetic field sensors are widely used in automobile control systems, for example, to detect ignition timing from a position of an engine crankshaft and/or camshaft, and to detect a position and/or rotation of an automobile wheel for anti-lock braking systems.

Sensors often process analog signals from sensing elements in the digital domain. To this end, ADCs are widely used to convert analog signals into digital signals. Various types of ADCs are used, including sigma delta converters and successive approximation converters as examples.

During manufacture and/or during use in an application, sensors and their components such as ADCs sometimes experience failures. These failures may be due to manufacturing defects, design defects, latent failures, or a combination of both as examples.

Sensor integrated circuits are widely used in automobile control systems and other safety critical applications. There are a variety of specifications that set forth requirements related to permissible sensor quality levels, failure rates, and overall functional safety. For example, some automotive applications require conformity to Automotive Safety Integrity Level (ASIL) standards. One approach to meeting such mandates has been to use redundant, identical circuits in a sensor integrated circuit. Another approach is to test parts during and after the manufacturing process. For example, some parts include self-test capabilities, i.e., internal circuitry that can be used by the part to test itself. These self-tests may include built-in self-tests (i.e., "BIST" tests) and can be used to test various aspect of the sensor circuitry.

SUMMARY

Described herein are circuits and methods for performing diagnostics on one or more ADCs. Some configurations include comparison in the analog domain of one or more ADC input signals with one or more of the ADC input signals that have been digitally converted and converted back to the analog domain by a digital-to-analog converter (DAC). Other configurations include comparison in the digital domain of one or more ADC input signals that have been converted to the digital domain to the one or more ADC input signals that are converted into the digital domain by a different ADC. Still other configurations involve injecting a pilot, or test signal into one or more ADCs and then filtering in the digital domain to recover the test signal. Comparison of the recovered test signal to a predetermined threshold can be used to determine the operational status of the one or more ADCs. These arrangements function to monitor the operational status of the ADC(s).

According to the disclosure, apparatus includes an ADC configured to convert an analog signal to a digital signal, a comparator having a first input responsive to the analog signal, a second input responsive to the digital signal, and an output at which a comparison signal is provided, and an output checker configured to process the comparison signal to generate a fault signal indicative of whether a fault has occurred in the ADC.

Features may include one or more of the following individually or in combination with other features. The analog signal can include a first analog signal and the sensor can further include a digital-to-analog converter (DAC) configured to convert the digital signal to a second analog signal, and wherein the comparator is an analog comparator responsive to the first analog signal at the first input and the second analog signal at the second input. The digital signal can include a first digital signal and the sensor can further include a second ADC configured to convert the analog signal to a second digital signal, wherein the comparator is a digital comparator responsive to the first digital signal at the first input and the second digital signal at the second input.

Also described is apparatus including a first ADC configured to convert a first analog signal to a first digital signal, a second ADC configured to convert a second analog signal to a second digital signal, and an analog summation circuit responsive to the first analog signal and the second analog signal and configured to generate an analog summation signal as a sum of the first analog signal and the second analog signal. The apparatus further includes a digital summation circuit responsive to the first digital signal and the second digital signal and configured to generate a digital summation signal as a sum of the first digital signal and the second digital signal and a comparator having a first input responsive to the analog summation signal, a second input responsive to the digital summation signal, and an output at which a comparison signal is provided.

Features may include one or more of the following individually or in combination with other features. The apparatus may further include an output checker configured to process the comparison signal to generate a fault signal indicative of whether a fault has occurred in one or both of the first ADC or the second ADC. The analog summation signal can include a first analog summation signal and the sensor can further include a digital-to-analog converter (DAC) configured to convert the digital summation signal to a second analog summation signal, wherein the comparator is an analog comparator responsive to the first analog summation signal at the first input and the second analog summation signal at the second input. The apparatus may further include a margin unit configured to adjust one or both of the first analog summation signal and the second analog summation signal. The digital summation signal may include a first digital summation signal and the sensor further include a third ADC configured to convert the analog summation signal to a second digital summation signal, wherein the comparator is a digital comparator responsive to the first digital summation signal at the first input and the second digital summation signal at the second input. The apparatus may further include a margin unit configured to adjust one or both of the first digital summation signal and the second digital summation signal. The first ADC, the second ADC, the analog summation circuit, the digital summation circuit, and the comparator can be part of a sensor configured to sense a parameter. The sensor can be a magnetic field sensor and can further include a first magnetic field sensing element configured to generate the first analog signal and a second magnetic field sensing element configured to generate the second analog signal. The apparatus can further include a first front end amplifier coupled to receive an output signal of the first magnetic field sensing element and configured to generate the first analog signal and a second front end amplifier coupled to receive an output signal of the second magnetic field sensing element and configured to generate the second analog signal. The first front end amplifier can include a first output at which the first analog signal is provided and a second output at which a copy of the first analog output signal is provided, wherein the analog summation circuit is coupled to receive the copy of the first analog output signal and wherein the second front end amplifier comprises a first output at which the second analog signal is provided and a second output at which a copy of the second analog output signal is provided, wherein the analog summation circuit is coupled to receive the copy of the second analog output signal. The first front end amplifier can be a chopper amplifier and the second front end amplifier can be a chopper amplifier. Each of the first ADC and the second ADC can include a Continuous Time Sigma Delta Modulator (CTSDM).

According to a further aspect, a method includes converting a first analog signal to a first digital signal, converting a second analog signal to a second digital signal, generating an analog summation signal as a sum of the first analog signal and the second analog signal, generating a digital summation signal as a sum of the first digital signal and the second digital signal, and comparing a first signal based on the analog summation signal to a second signal based on the digital summation signal to generate a comparison signal.

Features may include one or more of the following individually or in combination with other features. The method may include processing the comparison signal to determine whether a fault has occurred in one or both of the first ADC or the second ADC. The analog summation signal can include a first analog summation signal, and the method further include converting the digital summation signal to a second analog summation signal and wherein comparing comprises comparing the first analog summation signal to the second analog summation signal. The method may further include adjusting one or both of the first analog summation signal or the second analog summation signal before comparing. The digital summation signal may include a first digital summation signal, and the method may further include converting the analog summation signal to a second dial summation signal and wherein comparing comprises comparing the first digital summation signal to the second digital summation signal. The method can include adjusting one or both of the first digital summation signal and the second digital summation signal.

Also described is apparatus including a sensing element configured to generate an analog input signal indicative of a parameter to be sensed, an offset cancellation circuit coupled to receive the analog input signal and configured to remove an offset associated with the analog input signal, a test circuit coupled to receive the analog input signal and configured to combine a test signal with the analog input signal to generate a combined signal, wherein the test circuit is substantially identical to the offset cancellation circuit, an ADC having an input coupled to receive the combined signal and an output at which a digital signal corresponding to the analog input signal is provided, a recovery circuit configured to process the digital signal to recover the test signal, and a checker circuit configured to determine if an error has occurred in the ADC based on the recovered test signal.

Features may include one or more of the following individually or in combination with other features. The recovery circuit can include a bandpass filter. The checker circuit can include a comparator configured to compare the recovered test signal to a predetermined threshold. Each of the offset cancellation circuit and the test circuit can include a DAC configured to receive a digital control signal, at least one current source element controllable to add a current to the digital signal, at least one current sink element controllable to subtract a current from the digital signal, and a binary control signal configured to selectively enable or disable the at least one current source element and the at least one current sink element. The apparatus can further include a linearity checker circuit configured to adjust the digital control signal and compare the recovered test signal to an adjusted predetermined threshold. The sensing element can include a magnetic field sensing element. The offset cancellation circuit can be configured to remove the offset associated with the analog input signal during a first time period and wherein the test circuit is configured to combine the test signal with the analog input signal during a second time period that does not overlap with the first time period.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
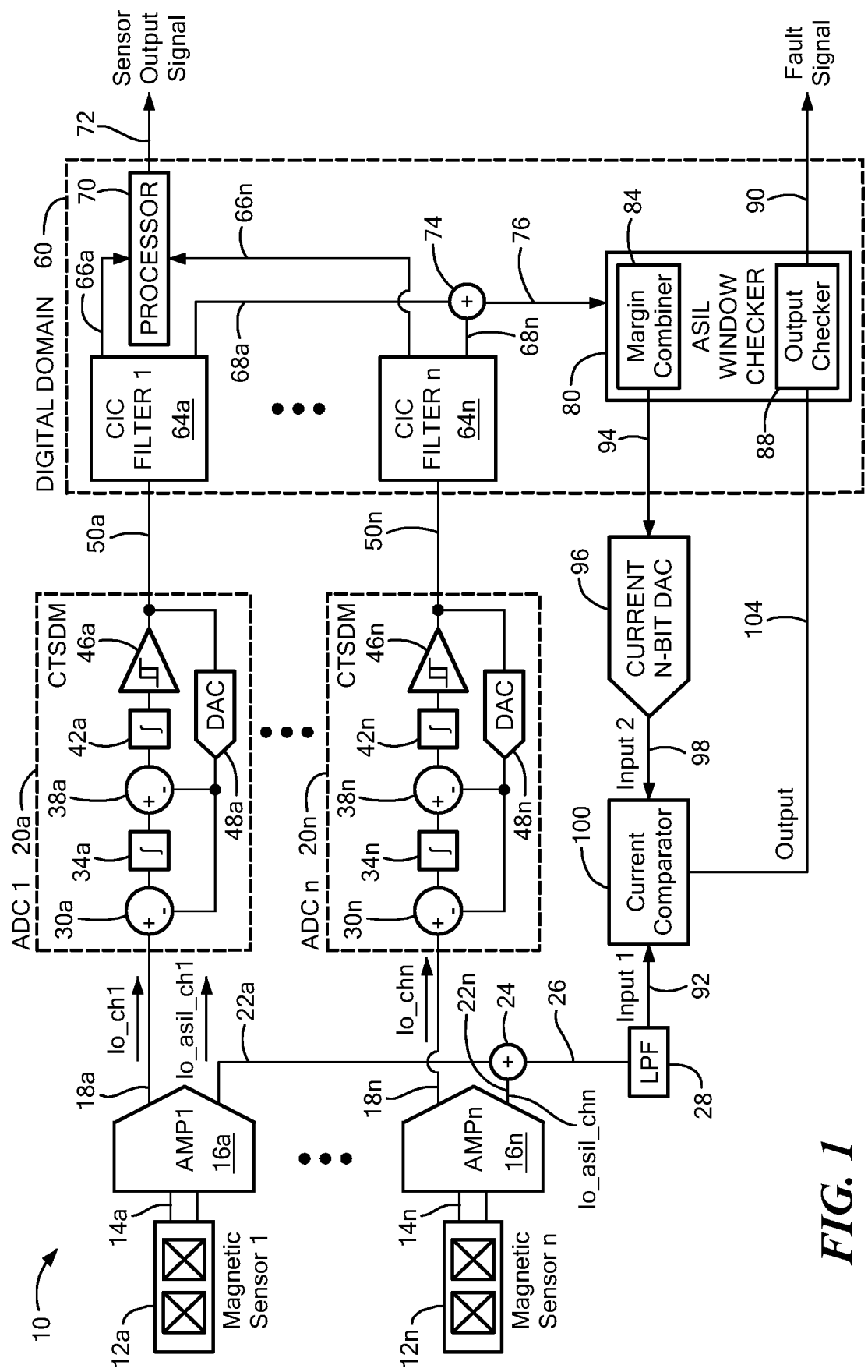
FIG. 1 is a block diagram of a magnetic field sensor implementing ADC diagnostics including signal comparison in the analog domain according to the disclosure.

Before describing the present disclosure, some introductory concepts and terminology are explained. As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate or in the plane of the substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of maximum sensitivity perpendicular to a substrate, while metal based or metallic magnetoresistance elements (e.g., GMR, TMR, AMR) and vertical Hall elements tend to have axes of maximum sensitivity parallel to a substrate.

As used herein, the term "magnetic field signal" is used to describe any signal that results from a magnetic field experienced by a magnetic field sensing element.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

It should be understood that a so-called "comparator" can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Referring to FIG. 1, a magnetic field sensor 10 includes an ADC 20a configured to convert an analog input signal 18a to a digital signal 50a, a comparator 100 having a first input responsive to the analog input signal 18a (and here responsive to a copy, or replica 22a of the analog input signal), a second input responsive to the digital signal 50a, and an output at which a comparison signal 104 is provided. A window checker 80, as may be designed to meet ASIL or other requirements, includes an output checker 88 configured to process the comparison signal 104 to generate a fault signal 90 indicative of whether a fault has occurred in the ADC 20a.

Fault signal 90 can be provided to internal or external circuitry or systems according to application requirements. For example, an external system controller and/or user can be informed that the sensor has a failure. Further, an external system controller can respond to a fault signal indication of a faulty ADC by shutting down the sensor 10 or by putting the sensor into a safe state or safe mode of operation in which portions of the sensor are disabled, thereby reducing power consumption.

In the example sensor 10, the analog input signal 18a is generated by one or more magnetic field sensing elements 12a, which sensing elements generate a magnetic field signal 14a indicative of a sensed magnetic field. For example, the sensed magnetic field can be affected by movement (e.g., rotation) of a target as may take a variety of forms, including, but not limited to a gear having gear teeth or a ring magnet having one or more pole pair. Also, linear arrangements of ferromagnetic objects that move linearly are possible. A permanent magnet can be placed at a variety of positions proximate to the target, resulting in fluctuations of the magnetic field as the gear rotates in a so-called "back-bias" arrangement. Sensing elements 12a can take a variety of forms, such as Hall effect elements or MR elements as non-limiting examples.

The magnetic field signal can be amplified by a front-end amplifier 16a. In some embodiments, amplifier 16a generates the output signal 18a in the form of an output current (e.g., Io_ch1). With this type of configuration, replica output signal 22a can be provided by the amplifier 16a for diagnostic processing, so that the main signal path (i.e., from signal 18a to sensor output signal 72) is not affected by the diagnostic processing.

In some embodiments, amplifier 16a is a so-called chopped amplifier with which offsets and low frequency noise can be reduced. To this end, amplifier 16a can include a switch, or modulator that modulates signal 14a at a chopping frequency. Chopping of the magnetic field signal 14a causes signal 18a to be shifted to a frequency related to the chopping frequency (e.g., fchop). In such embodiments, it will be appreciated by those of ordinary skill in the art that a demodulator (not shown) is provided to demodulate the chopped amplifier output signal in order to recover the signal modulated by the chopped amplifier 16a.

The magnetic field sensor 10 can include more than the one ADC 20a and, according to FIG. 1, can include anywhere from one to "n" ADCs 20a-20n, where n can be two or greater. Each of the "n" ADCs 20a-20n is configured to convert a respective analog input signal 18a-18n to a digital signal 50a-50n, as shown. Analog input signals 18a-18n can be generated by a front-end amplifier 16a-16n in response to a magnetic field signal 14a-14n generated by one or more magnetic field sensing elements 12a-12n, respectively, as shown.

In embodiments with more than one ADC, the sensor 10 includes an analog summation circuit 24 responsive to the analog replica signals 22a-22n and configured to generate an analog summation signal 26 as a sum of the signals 22a-22n. In the digital domain 60, the sensor 10 includes a digital summation circuit 74 responsive to the digital signals 50a-50n from the ADCs 20a-20n, respectively, and configured to generate a digital summation signal 76 as a sum of the digital signals. Comparator 100 has a first input responsive to the analog summation signal 26 (in the form of a signal 92), a second input responsive to the digital summation signal 76 (in the form of a signal 98), and an output at which the comparison signal 104 is provided. The output checker 88 is configured to process the comparison signal 104 to generate a fault signal 90 indicative of whether a fault has occurred in any of the ADCs 20a-20n.

The ADCs 20a-20n can take various forms, such as the illustrated Continuous Time Sigma Delta Modulators (CTSDMs). As CTSDM ADCs, each ADC 20a-20n can have a forward signal path including a summation element 30a-30n, an integrator 34a-34n, a second summation element 38a-38n, a second integrator 42a-42n, and an operational amplifier 46a-46n. A feedback path of each CTSDM ADC 20a-20n can include a DAC 48a-48n generating a feedback signal for coupling to summation elements 30a-30n and 38a-38n, as shown.

Conversion by the ADCs 20a-20n includes filtering in the digital domain 60 by an associated digital filter 64a-64n, as may take the form of a Cascaded Integrator Comb (CIC) filter in order to cancel quantization noise. Each CIC filter 64a-64n generates a main signal path output signal 66a-66n for coupling to a processor 70 and a replica output signal 68a-68n for diagnostic processing. It will be appreciated by those of ordinary skill in the art that other types of ADCs are possible and will benefit from the diagnostic circuitry and techniques described herein.

Processor 70 operates on the main signal path digital signals 66a-66n in order to generate a sensor output signal 72 indicative of one or more parameters sensed by the magnetic field sensing elements 12a-12n in a format tailored to meet application requirements. For example, sensor 10 can be an angle sensor that senses an angle of a direction of a magnetic field, a current sensor that senses a magnetic field generated by a current carried by a conductor, a magnetic switch that senses proximity of a ferromagnetic object, a rotation detector (or movement or speed detector) that senses passing ferromagnetic articles, for example, magnetic domains of a ring magnet or a ferromagnetic target (e.g., gear teeth) where the magnetic field sensor is used in combination with a back-bias or other magnet, or a magnetic field sensor that senses a magnetic field density of a magnetic field, as non-limiting examples. Example sensor output signal formats include an Inter-Integrated Circuit (I2C) interface, a Controller Area Network (CAN) bus interface, a Single Edge Nibble Transmission (SENT) interface, as non-limiting examples.

The replica digital signals 68a-68n are coupled to summation element 74 that is configured to generate the digital summation signal 76. The window checker 80 can include a margin unit 84 with which margin codes are combined (e.g., added and/or subtracted) from the digital summation signal 76 for comparison by comparator 100. An output signal 94 of the margin combiner 84 is converted to the analog domain by a DAC 96, as can take the form of an N-bit current DAC, to generate comparator input signal 98.

It will be appreciated by those of ordinary skill in the art that the illustrated ADC diagnostics advantageously does not affect the main signal path with which the sensor output signal 72 is generated since the diagnostic comparison by comparator 100 is achieved in a dedicated diagnostic path using replica signals.

A margin code is a digital word that is combined with the digital summation signal 76 so that the output checker 88 can reconcile the comparator output signal 104 in order to determine whether an ADC fault has occurred. For example, a first margin code can be added to the digital summation signal 76 at first times to generate comparator input signal 98 for comparison to the analog summation signal 26 in order to determine if the signal 98 is greater than the analog summation signal 26 as would be expected based on the addition of the margin code. If the signal 98 is greater than the signal 92, then the comparator output signal 104 can be at a first logic level that is processed by the output checker 88 to determine that the ADCs 20a-20n are operating properly. In this scenario, the fault signal 90 indicates that the ADCs 20a-20n are operating properly. If however the signal 98 is less than the signal 92, then the comparator output signal 104 can be at a second logic level that is processed by the output checker 88 to determine that one or more of the ADCs 20a-20n is not operating properly and the fault signal 90 can be generated to so indicate the presence of an ADC fault. The fault in this scenario would indicate that output of one or more ADCs 20a-20n is stuck low as the signal 98 remains below the analog summation signal 92 even when a margin code is added.

A second margin code can be subtracted from the digital summation signal 76 at second times to generate comparator input signal 98 for comparison to the analog summation signal 26 in order to determine if the signal 98 is less than the analog summation signal 26 as would be expected based on the subtraction of the margin code. It will be appreciated by those of ordinary skill in the art that the second margin code can be the same as, or different than the first margin code. If the signal 98 is less than the signal 92, then the comparator output signal 104 can be at the first logic level that is processed by the output checker 88 to determine that the ADCs 20a-20n are operating properly. In this scenario, the fault signal 90 indicates that the ADCs 20a-20n are operating properly. If however the signal 98 is greater than the signal 92, then the comparator output signal 104 can be at the second logic level that is processed by the output checker 88 to determine that one or more of the ADCs 20a-20n is not operating properly and the fault signal 90 can be generated to so indicate the presence of an ADC fault. The fault in this scenario would indicate that output of one or more ADCs 20a-20n is stuck high as the signal 98 remains above the analog summation signal 92 even when a margin code is added.

Comparator 100 can be a current comparator and be configured to compare the input signal 92 to the input signal 98 in order to generate output signal 104, as shown. Input signal 92 can be a filtered version of the analog summation signal 26. For example, a low pass filter 28 can filter the analog summation signal 26 and generate the comparator input signal 92, as shown. The low pass filter 28 adds a delay to the analog summation signal 26 which can reduce or eliminate errors due to the delay of the signal 98 relative to the analog summation signal 26. Additionally, the low pass filter 28 can cancel AC offset if the sensor 10 is chopped.

It will be appreciated by those of ordinary skill in the art that the first times when margin combiner 84 adds a margin code to the digital summation signal 76 and the second times when the margin combiner subtracts a margin code from the digital summation signal can be a continuous sequence of first and second time periods occurring at a rate selected to reliably detect ADC faults and tailored to the speed of the associated processing circuitry (e.g., comparator 100).

It will also be appreciated by those of ordinary skill in the art that sensor 10 could perform the described ADC diagnostics voltage signals rather than the analog current signals 18a-18n, in which case generation of replica analog signals 22a-22n and replica digital signals 68a-68n could be omitted and the current comparator 100 could be a voltage comparator.

Figure 2:
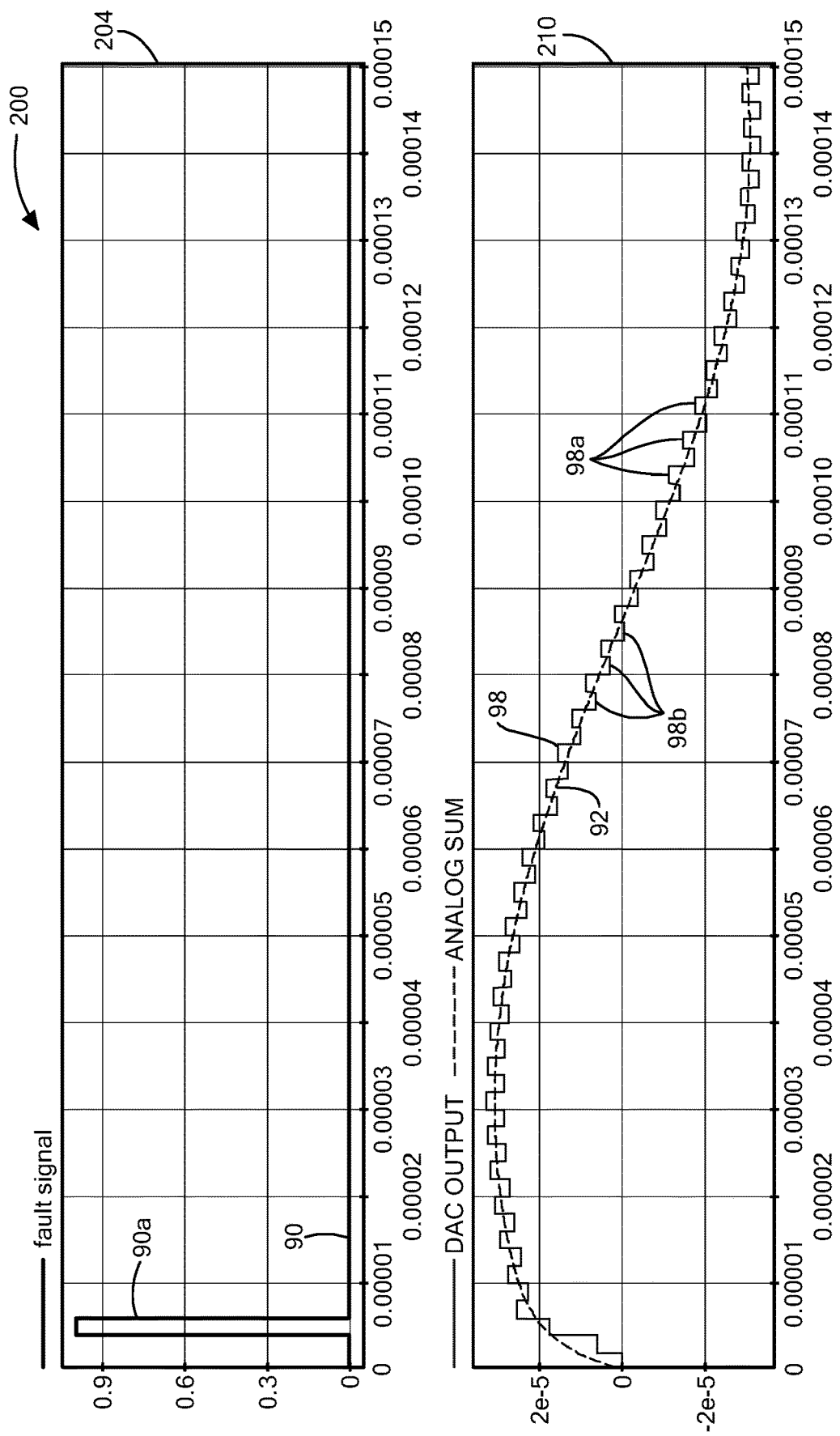
FIG. 2 includes an example fault signal waveform and waveforms corresponding to an output signal of one or more ADCs and an output signal of one or more DACs under normal operating conditions without an ADC fault present according to the disclosure.

Referring to FIG. 2, waveforms associated with the sensor 10 of FIG. 1 are shown with the vertical axis denoting units of voltage or current and the horizontal axis denoting time. Plot 204 illustrates the fault signal 90 and, in the illustrated embodiment, a logic low level of fault signal 90 can indicate the absence of an ADC fault or failure and a logic high level (e.g., of approximately 1 volt) can indicate the presence of an ADC fault or failure. Plot 210 illustrates comparator input signals 92 and 98, with input signal 92 being indicative of the analog summation signal 26 (as may be filtered by filter 28) and input signal 98 being indicative of the digital summation signal 76 with margin codes added or subtracted by margin combiner 84 and having been brought back to the analog domain by DAC 96 as explained above.

Plot 210 illustrates an operating condition in which there are no ADC faults present. This can be seen by the DAC output signal 98 and the analog summation signal 92 closely tracking one another. In other words, when margin codes are added to the digital summation signal 76 (e.g., at example times labeled 98a), the comparator output signal 104 is at a logic high level as is expected and when margin codes are subtracted from the digital summation signal (e.g., at example times labeled 98b), the comparator output signal 104 is at a logic low level as is expected.

Output checker 88 interprets the comparator output signal 104 based the expected relationship between the compared signals 92, 98 given the addition or subtraction of margin codes. In the illustrated example, in which the DAC output signal 98 is greater than the analog summation signal 92 when margin codes are added to the digital summation signal 76 (i.e., at times labeled 98a), fault signal 90 is at a logic low level to indicate that no fault has been detected. Similarly, since DAC output signal 98 is less than the analog summation signal when margin codes are subtracted from the digital summation signal 76 (i.e., at times labeled 98b), fault signal 90 is at a logic low level to indicate that no fault has been detected.

It will be appreciated by those of ordinary skill in the art that while certain signals are described as being at a logic high level or logic low level to indicate certain corresponding conditions, the signal levels alternatively could be inverted to indicate the described conditions.

Example fault signal 90 has a single pulse 90a occurring shortly after power up of the sensor 10. This pulse 90a occurs because it takes time for the output 98 of DAC 96 to reach the level of the analog summation signal 92 due to signal processing delays. In general however, there is an initial power on time during which sensor 10 does not output signals 72, 90 so there is no communication of a false ADC error condition.

Figure 3:
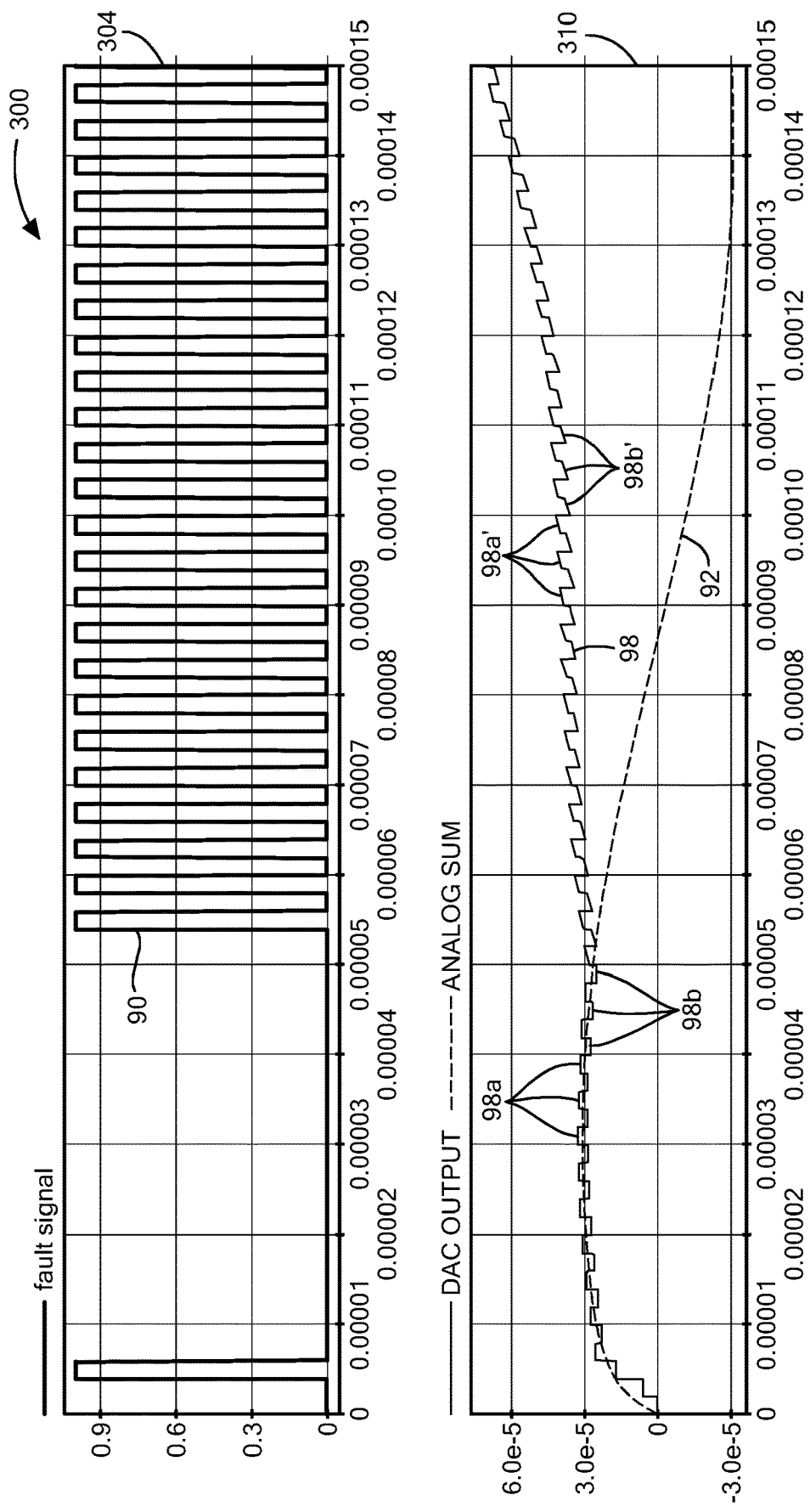
FIG. 3 includes an example fault signal waveform and waveforms corresponding to an output signal of one or more ADCs and an output signal of one or more DACs under operating conditions including an ADC fault according to the disclosure.

Referring to FIG. 3, further example waveforms associated with the sensor 10 of FIG. 1 are shown with the vertical axis denoting units of voltage or current and the horizontal axis denoting units of time. Plot 304 illustrates the fault signal 90 (here again with a logic low level indicative of the absence of an ADC fault and a logic high level indicative of the presence of an ADC fault) and plot 310 illustrates the comparator input signals 92 and 98.

In the example of FIG. 3, plot 310 illustrates an operating condition in which an ADC fault occurs. In particular, at a time of approximately 50 pec, the DAC output signal 98 drifts from its expected value of the analog summation signal 92. This fault condition can be described as one or more of the ADCs 20a-20n being stuck high. Thus, prior to the fault occurring at approximately 50 pec, the DAC output signal 98 and the analog summation signal 92 closely track one another such that when margin codes are added to the digital summation signal 76 (e.g., at example times labeled 98*a*), the comparator output signal 104 is at a logic high level as is expected and when margin codes are subtracted from the digital summation signal 76 (e.g., at example times labeled 98*b*), the comparator output signal 104 is at a logic low level as is expected.

Once the fault occurs at time 50 pec however, the DAC output signal 98 no longer tracks closely with the analog summation signal 92. Rather, when a margin code is added to the digital summation signal 76 (e.g., at example times labeled 98*a*'), the comparator output signal 104 is at a logic high level as is expected; however, when a margin code is subtracted from the digital summation signal (e.g., at example times labeled 98*b*'), the comparator output signal 104 is still at a logic low level and this is not the expected relationship between the comparator input signals under the condition of subtracting a margin code. Thus, output checker 88 that is configured to interpret the comparator output signal 104 based on the expected relationship between the compared signals 92, 98 generates fault signal 90 having transitions to a logic high level to indicate the presence of a fault at times (e.g., 98*b*') when the comparator output signal is not at its expected level.

Figure 4:
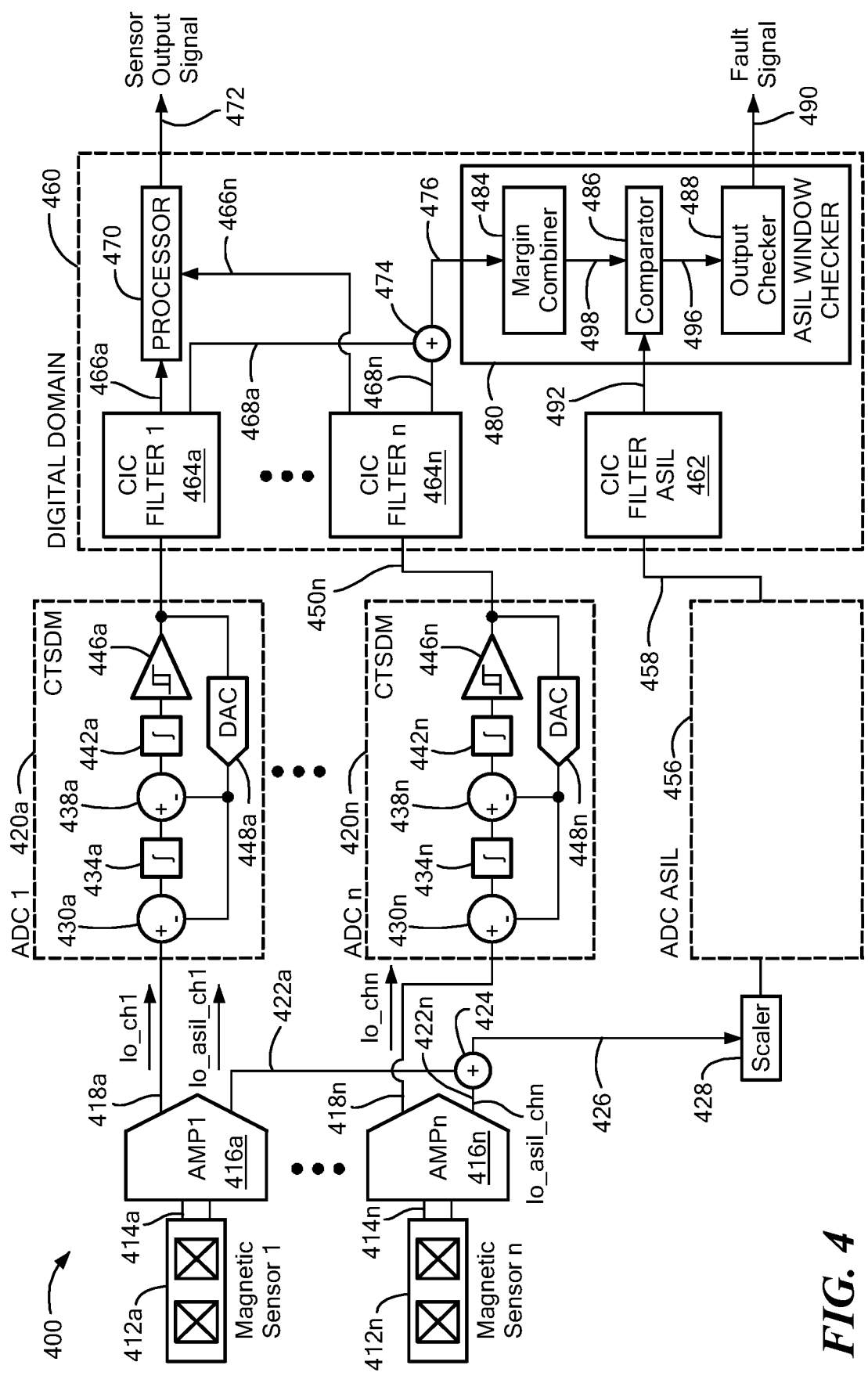
FIG. 4 is a block diagram of a magnetic field sensor implementing ADC diagnostics including signal comparison in the digital domain according to the disclosure.

Referring to FIG. 4, an alternative sensor 400 includes one or more ADCs 420*a*-420*n*, each configured to convert a respective analog input signal 418*a*-418*n* into a digital signal 450*a*-450*n*, a comparator 486 having a first input responsive to the analog input signals 418*a*-418*n* (and here responsive to replicas 422*a*-422*n* of the analog input signals), a second input responsive to the digital signals 450*a*-450*n*, and an output at which a comparison signal 496 is provided. A window checker 480, as may be designed to meet ASIL or other requirements, includes an output checker 488 configured to process the comparison signal 496 to generate a fault signal 490 indicative of whether a fault has occurred in any of the ADCs 420*a*-420*n*. Fault signal 490 can be provided to internal or external circuitry or systems according to application requirements.

Sensor 400 is described herein as including more than one ADCs 420*a*-420*n* (i.e., "n" is two or greater) and associated circuitry. However, it will be appreciated by those of ordinary skill in the art that sensor 400 can include a single ADC 420*a*, in which case summation elements 424 and 474 can be omitted.

Analog input signals 418*a*-418*n* can be generated by one or more magnetic field sensing elements 412*a*-412*n* that generate magnetic field signals 414*a*-414*n* for processing by front-end amplifiers 416*a*-416*n*, respectively. In embodiments in which amplifiers 416*a*-416*n* generate output signals 418*a*-418*n* in the form of an output current (e.g., Io_ch1), replica output signals 422*a*-422*n* can be provided for diagnostic processing, so that the main signal path (i.e., from signals 418*a*-418*n* to sensor output signal 472) is not affected by the diagnostic processing. Amplifiers 416*a*-416*n* can be chopped amplifiers, in which case demodulators (not shown) are provided to demodulate the chopped amplifier output signals in order to recover the signal modulated by the chopped amplifiers 416*a*-416*n*.

An analog summation circuit 424 responsive to the analog replica signals 422*a*-422*n* is configured to generate an analog summation signal 426 as a sum of the signals 422*a*-422*n*.

Sensor 400 differs from sensor 10 of FIG. 1 in that the comparison of the analog input signal(s) 422*a*-422*n* to the converted digital signal(s) 450*a*-450*n* is performed in the digital domain 460. To this end, sensor 400 includes an additional ADC 456 configured to convert the analog summation signal 426 into a digital signal 458. ADC 456 can be the same as or similar to ADCs 420*a*-420*n*. Alternatively, ADC 456 can be a different type of ADC than ADCs 420*a*-420*n*. For example, ADC 456 can be a less accurate ADC (e.g., slower and/or providing lower resolution), but can be a lower cost ADC (e.g., in terms of area and/or power consumption). As one non-limiting example, ADC 456 can take the form of a dual slope ADC.

A scaler 428 can be provided to scale down the level of the analog summation signal 426 in order to preserve the dynamic range of the ADC 456. As a non-limiting example, analog summation signal 426 can be scaled down by 1/n, where n is the number of ADCs 420*a*-420*n*. A rescaler (not shown) can be provided in the digital domain 460 in order to increase the magnitude of the resulting signal for comparison.

The digital version 458 of the analog summation signal 426 can be filtered by a filter 462 in the digital domain 460. For example, in embodiments in which the ADC 456 is a CTSDM ADC, conversion can include filtering by a CIC filter 462. The output signal 492 of filter 462 can thus be indicative of the summation of the analog replica signals 422*a*-422 and can be coupled to comparator 486, as shown.

In the digital domain 460, the sensor 400 includes a digital summation circuit 474 responsive to the digital signals 450*a*-450*n* from the ADCs 420*a*-420*n*, respectively, and configured to generate a digital summation signal 476 as a sum of the digital signals.

Comparator 486 thus is coupled to receive a first input signal 492 responsive to the analog summation signal 426 and a second input signal 498 responsive to the digital summation signal 476. A comparison signal 496 provided by the comparator 486 is coupled to an output checker 488 that is configured to process the comparison signal 496 to generate a fault signal 490 indicative of whether a fault has occurred in any of the ADCs 420*a*-420*n*.

The ADCs 420*a*-420*n* can take various forms, such as the illustrated Continuous Time Sigma Delta Modulators (CTSDMs), each of which can have a forward signal path including a summation element 430*a*-430*n*, an integrator 434*a*-434*n*, a second summation element 438*a*-438*n*, a second integrator 442*a*-442*n*, and an operational amplifier 446*a*-446*n*. A feedback path of each CTSDM ADC 420*a*-420*n* can include a DAC 448*a*-448*n* generating a feedback signal for coupling to summation elements 430*a*-430*n* and 438*a*-438*n*, as shown.

Conversion by the ADCs 420*a*-420*n* includes filtering in the digital domain 460 by an associated digital filter 464*a*-464*n*, as may take the form of a Cascaded Integrator Comb (CIC) filter in order to cancel quantization noise. Each CIC filter 464*a*-464*n* generates a main signal path output signal 466*a*-466*n* for coupling to a processor 470 and a replica output signal 468*a*-468*n* for diagnostic processing. It will be appreciated by those of ordinary skill in the art that other types of ADCs are possible and will benefit from the diagnostic circuitry and techniques described herein.

Processor 470 operates on the main signal path digital signals 466*a*-466*n* in order to generate a sensor output signal 472 indicative of one or more sensed parameters in a format tailored to meet application requirements. For example, sensor 400 can be an angle sensor that senses an angle of a direction of a magnetic field, a current sensor that senses a magnetic field generated by a current carried by a conductor, a magnetic switch that senses proximity of a ferromagnetic object, a rotation detector (or movement or speed detector) that senses passing ferromagnetic articles, for example, magnetic domains of a ring magnet or a ferromagnetic target (e.g., gear teeth) where the magnetic field sensor is used in combination with a back-bias or other magnet, or a magnetic field sensor that senses a magnetic field density of a magnetic field, as non-limiting examples. Example sensor output signal formats include an Inter-Integrated Circuit (I2C) interface, a Controller Area Network (CAN) bus interface, a Single Edge Nibble Transmission (SENT) interface, as non-limiting examples.

The replica digital signals 468a-468n are coupled to summation element 474 that is configured to generate the digital summation signal 476. It will be appreciated by those of ordinary skill in the art that the illustrated ADC diagnostics advantageously does not affect the main signal path with which the sensor output signal 472 is generated since the diagnostic comparison by comparator 400 is achieved in a dedicated diagnostic path using replica signals.

The window checker 480 can include a margin unit 484 with which margin codes are combined (e.g., added and/or subtracted) from the digital summation signal 476 for comparison by comparator 486. An output signal 498 of the margin combiner 484 is coupled to comparator 486 as shown. As explained above, a margin code is a digital word that is combined with the digital summation signal 476 so that the output checker 488 can reconcile the comparator output signal 496 in order to determine whether an ADC fault has occurred.

For example, a first margin code can be added to the digital summation signal 476 at first times to generate comparator input signal 498 for comparison to the analog summation signal 426 in order to determine if the signal 498 is greater than the analog summation signal 426 as would be expected based on the addition of the margin code. If the signal 498 is greater than the signal 492, then the comparator output signal 496 can be at a first logic level that is processed by the output checker 488 to determine that the ADCs 420a-420n are operating properly. In this scenario, the fault signal 490 indicates that the ADCs 420a-420n are operating properly. If however the signal 498 is less than the signal 492, then the comparator output signal 496 can be at a second logic level that is processed by the output checker 488 to determine that one or more of the ADCs 420a-420n is not operating properly and the fault signal 490 can be generated to so indicate the presence of an ADC fault. The fault in this scenario would indicate that output of one or more ADCs 420a-420n is stuck low as the signal 498 remains below the analog summation signal 492 even when a margin code is added.

A second margin code can be subtracted from the digital summation signal 476 at second times to generate comparator input signal 498 for comparison to the analog summation signal 426 in order to determine if the signal 498 is less than the analog summation signal 426 as would be expected based on the subtraction of the margin code. It will be appreciated by those of ordinary skill in the art that the second margin code can be the same as, or different than the first margin code. If the signal 498 is less than the signal 492, then the comparator output signal 496 can be at the first logic level that is processed by the output checker 488 to determine that the ADCs 420a-420n are operating properly. In this scenario, the fault signal 490 indicates that the ADCs 420a-420n are operating properly. If however the signal 498 is greater than the signal 492, then the comparator output signal 496 can be at the second logic level that is processed by the output checker 488 to determine that one or more of the ADCs 420a-420n is not operating properly and the fault signal 490 can be generated to so indicate the presence of an ADC fault. The fault in this scenario would indicate that output of one or more ADCs 420a-420n is stuck high as the signal 498 remains above the analog summation signal 492 even when a margin code is added.

It will be appreciated by those of ordinary skill in the art that the first times when margin combiner 484 adds a margin code to the digital summation signal 476 and the second times when the margin combiner subtracts a margin code from the digital summation signal 476 can be a continuous sequence of first and second times occurring at a rate selected to reliably detect ADC faults and tailored to the speed of the associated processing circuitry (e.g., comparator 486).

It will also be appreciated by those of ordinary skill in the art that sensor 10 could perform the described ADC diagnostics on analog voltage signals rather than the illustrated analog current signals 418a-418n, in which case generation of replica analog signals 422a-422n and replica digital signals 468a-468n could be omitted and the current comparator 486 could be a voltage comparator.

Figure 5:
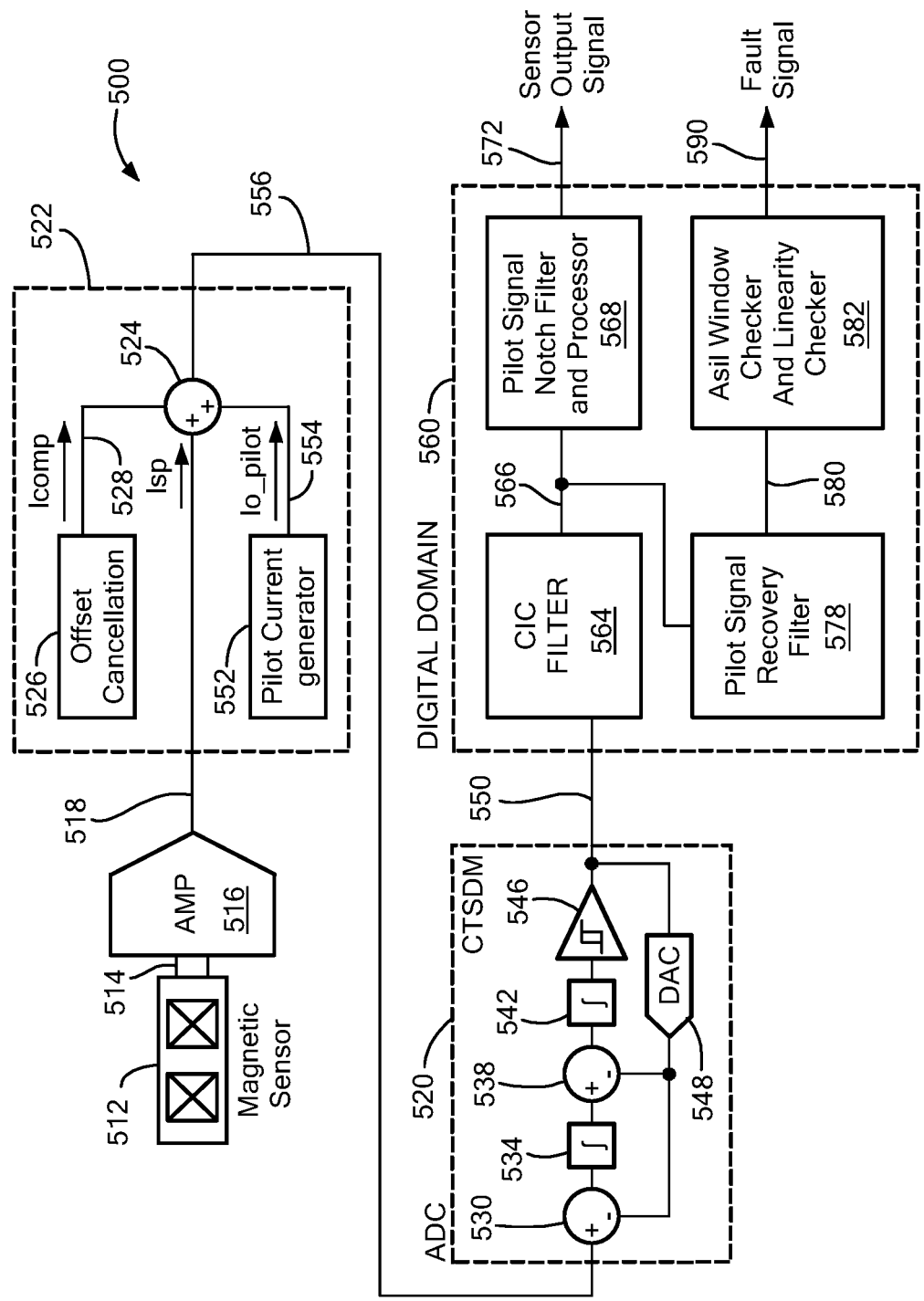
FIG. 5 is a block diagram of a magnetic field sensor implementing ADC diagnostics including test signal injection and offset cancellation according to the disclosure.

Referring to FIG. 5, a magnetic field sensor 500 includes ADC diagnostics based on injecting a test, or pilot signal. Sensor 500 includes a sensing element 512 configured to generate an analog input signal 518 indicative of a parameter to be sensed. A circuit 522 includes an offset cancellation circuit 526 and a test circuit 552 coupled to receive the analog input signal 518 and configured to generate a combined signal 556. The offset cancellation circuit 526 is configured to reduce or eliminate offset in the signal 518 (as can be associated with certain magnetic field sensing elements 512) and the test circuit 552 is configured to combine a pilot current, or test signal 554 with the analog input signal 518.

Figure 6:
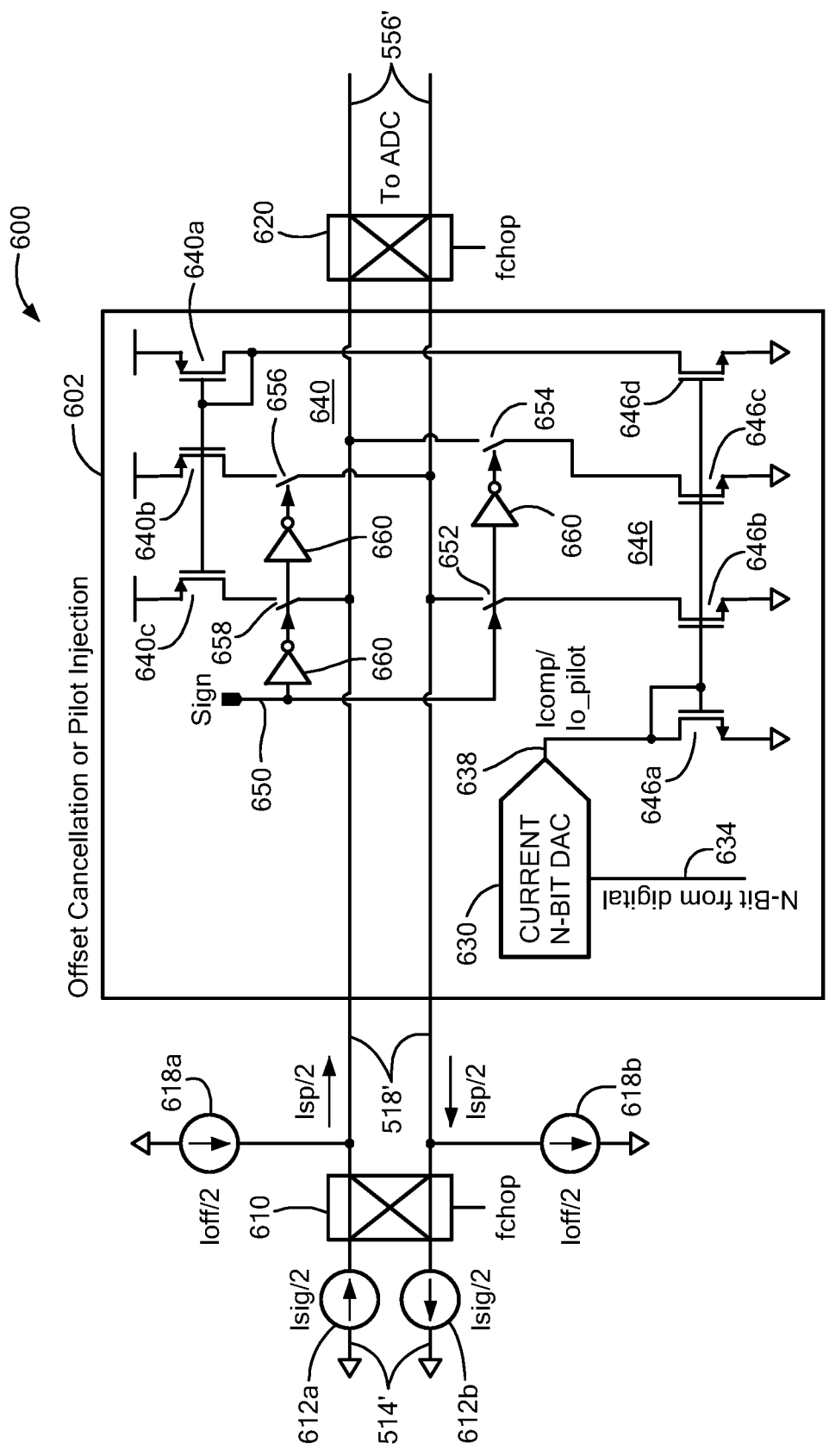
FIG. 6 is a block diagram of an example circuit for use as one or both of the offset cancellation and test signal generation circuits of the sensor of FIG. 5.

Offset cancellation circuit 526 can generate a signal Icomp 528 to be combined with the amplifier output signal 518 by a summation element 524 that is configured to add and/or subtract signals in order to thereby cancel out the offset of the Isp signal 518. The test circuit 552 can generate a test signal Io_pilot 554 also to be combined with the amplifier output signal 518 by summation element 524. An example offset cancellation circuit 526 and test circuit 552 are shown in FIG. 6.

In embodiments, the test signal 554 and the offset compensation signal 528 can be combined with the amplifier output signal 518 at the same time to generate a combined signal 556. Alternatively, as explained below in connection with FIG. 6, a single circuit can be provided to perform both the offset cancellation function and the test signal generation function and its functionality can be time multiplexed.

According to an aspect of the disclosure described further below in connection with FIG. 6, the test circuit 552 can be substantially identical to the offset cancellation circuit 526. This configuration advantageously leverages circuit design efficiencies.

In the example sensor 500, the analog input signal 518 is generated by one or more magnetic field sensing elements 512, which sensing elements generate a magnetic field signal 514 that can be amplified by a front-end amplifier 516. In some embodiments, amplifier 516 generates the output signal 518 in the form of an output current (e.g., Isp).

In some embodiments, amplifier 516 is a so-called chopped amplifier with which offsets and low frequency noise can be reduced. To this end, amplifier 516 can include a switch, or modulator that modulates signal 514 at a chopping frequency. Chopping of the magnetic field signal 514 causes signal 518 to be shifted to a frequency related to the chopping frequency (e.g., fchop). In such embodiments, a demodulator (not shown) can be provided to demodulate the chopped amplifier output signal in order to recover the signal modulated by the chopped amplifier 516.

An ADC 520 has an input coupled to receive and convert the combined signal 556 into a digital signal 550. ADC 520 can take various forms including, but not limited to the illustrated CTSDM ADC that can have a forward signal path including a summation element 530, an integrator 534, a second summation element 538, a second integrator 542, and an operational amplifier 546. A feedback path of the CTSDM ADC 520 can include a DAC 548 generating a feedback signal for coupling to summation elements 530 and 538, as shown. In the case of the illustrated CTSDM ADC 520, conversion can include filtering in the digital domain 560, such as with the illustrated CIC filter 564, to generate a filtered signal 566 as the sum of the test and sensor signals.

In the digital domain 560, the sensor 500 includes a main signal path for processing signal 566 including a test signal notch filter and processor 568. In order to recover the main signal path signal, the test signal 554 is removed by the notch filter 568. Thus, notch filter 568 can have a notch frequency at the frequency of the test signal 554.

Processor 568 operates on the main signal path signal digital signal 566 in order to generate a sensor output signal 572 indicative of one or more sensed parameters in a format tailored to meet application requirements. For example, sensor 500 can be an angle sensor that senses an angle of a direction of a magnetic field, a current sensor that senses a magnetic field generated by a current carried by a conductor, a magnetic switch that senses proximity of a ferromagnetic object, a rotation detector (or movement or speed detector) that senses passing ferromagnetic articles, for example, magnetic domains of a ring magnet or a ferromagnetic target (e.g., gear teeth) where the magnetic field sensor is used in combination with a back-bias or other magnet, or a magnetic field sensor that senses a magnetic field density of a magnetic field, as non-limiting examples. Example sensor output signal formats include an Inter-Integrated Circuit (I2C) interface, a Controller Area Network (CAN) bus interface, a Single Edge Nibble Transmission (SENT) interface, as non-limiting examples.

Diagnostic processing in the digital domain can include a recovery circuit 578 configured to process the digital signal 566 to recover the test signal and a checker circuit 582 configured to determine if an error has occurred in the ADC 520 based on the recovered test signal 580. The recovery circuit 578 can include a bandpass filter designed to pass the frequency of the injected test signal 554 and to reject the frequency of the main signal path signal.

The checker 582 can compare the amplitude of the recovered test signal 580 to a threshold window to determine if an error has occurred in the ADC 520. For example, if the recovered test signal 580 is within a predetermined range of a predetermined threshold, then it can be determined that the ADC 520 is operating properly; whereas, if the recovered test signal 580 is outside of the predetermined range of the predetermined threshold, then it can be determined that an error has occurred in the ADC. In this way, the checker 582 can flag an error if the level of the recovered test signal 580 is not within an expected range.

Additional functionality of the checker circuit 582 can include checking linearity of the ADC 520. To this end, the test signal 554 can be incremented and the recovered signal 580 can be compared to an incremented, expected threshold. For example, if the test signal level is doubled, the recovered test signal 580 is expected to be doubled.

Regarding the magnitude of the test signal 554, a larger magnitude test signal can facilitate fault signal generation since the checker 582 will compare a larger recovered test signal 580 to a predetermined threshold. However, a higher test signal level will reduce the dynamic range of the ADC 520.

The frequency of the test signal Io_pilot 554 can be selected based on various design considerations, including but not limited to whether or not the amplifier 516 is a chopped amplifier. In systems in which the amplifier 516 is chopped, the frequency of the test signal 554 can be close to, or a multiple of the chopping frequency as this arrangement can facilitate separation of the test signal from the main signal path for further processing to generate the sensor output signal 572. For example, the frequency of the test signal 554 can be one-half of the chopping frequency. In embodiments in which the digital block generates the chopping frequency and the test signal frequency, both can be a multiple of the digital clock. Notch filter 568 can remove a high frequency signal resulting from the chopping.

In embodiments in which the amplifier 516 is not chopped, the frequency of the test signal 554 can be a multiple of the digital clock signal. In general, the test signal 554 is modulated at a frequency higher than the bandwidth of the signal 518, which signal 518 is generally at a lower frequency for mechanical applications.

The Icomp signal 528 can be determined during a calibration phase, for example by setting the signal to zero and adjusting the level of the Icomp signal until the output gets to zero. Alternatively, the level of the Icomp signal 528 can be pre-set based on typical values. A higher Icomp signal level will reduce the dynamic range of the ADC 520, but when detecting the amplitude by the pilot signal recovery filter 578, it will be less affected by the effective signal.

Sensor 500 is shown to include a single ADC 520. However, it will be appreciated by those of ordinary skill in the art that sensor 500 can include any number of ADCs with which diagnostics are performed based on test signal injection. In particular, sensor 500 can include anywhere from one to "n" ADCs that can be the same as or similar to ADC 520, where n can be two or greater. In the case of more than one ADC, the sensor 500 can include respective front end components (that can be the same as or similar to sensing elements(s) 512 and amplifier 516), respective offset cancellation and test circuits (that can be the same as or similar to test circuit 522), and respective digital domain components (that can be the same as or similar to the components of digital domain 560).

Advantageously, the diagnostics achieved with the test signal injection can be performed continuously during sensor operation by continuously monitoring the output of the checker 582.

It will be appreciated by those of ordinary skill in the art that although the test circuit 552 is shown to inject the test signal 554 after the amplifier 516, in embodiments, the test signal can be injected before the amplifier 516.

Referring also to FIG. 6, apparatus 600 can represent a portion of a sensor (e.g., sensor 500 of FIG. 5) and includes a circuit 602 that can provide the offset cancellation circuit 526 and/or the test signal generator 552 of FIG. 5. In other words, sensor 500 can include a single instance of circuit 602, in which case time multiplexing can be used in order to operate the circuit as an offset cancellation circuit during first time periods and as a test signal generator during second, non-overlapping time periods. In such an embodiment, the recovery filter 578 can remove any offset that has not been canceled. Alternatively, sensor 500 can include two instances of circuit 602, one to implement offset cancellation and the other to generate the test signal, which two circuits can operation simultaneously.

Apparatus 600 is coupled to receive a magnetic field signal 514' that can be the same as or similar to magnetic field signal 514 of FIG. 5, but here shown in the form of a differential signal with sources 612a, 612b representing respective differential components of the signal 514'.

A chopping switch 610 represents signal chopping at a chopping frequency of fchop, as may be performed by an amplifier (e.g., amplifier 516 of FIG. 5) in some embodiments. If the sensor includes chopping, a demodulator 620 can be provided before the resulting signal 556' is coupled to the ADC (e.g., ADC 520 of FIG. 5). However, it will be appreciated by those of ordinary skill in the art that chopping (and the accompanying demodulation) is not required.

Sources 618a, 618b represent respective differential components of offset associated with the signal 518', which offset components 618a, 618b are superimposed on the signal 518'. When passing through the circuit 602 operating as an offset cancellation circuit, a current can be added to or subtracted from signal 518' in order to cancel the offset.

Circuit 602 includes a DAC 630 configured to receive a digital control signal 634, at least one current source element 640 controllable to add a current to the signal 518', and at least one current sink element 646 controllable to subtract a current from the signal 518'. In the example embodiment, current source elements 640 can include a plurality of current sources 640a-640c and current sink elements 646 can include a plurality of current sinks 646a-646d. Current sources 640b, 640c can be selectively coupled (by control of series switches 656, 658, respectively) to add current to signal 518'. Current sinks 646b, 646c can be selectively coupled (by control of series switches 652, 654, respectively) to subtract current from the differential signal 518'.

DAC 630 generates an analog signal 638 (Icomp 528 of FIG. 5 for circuit 602 operated as an offset cancellation circuit and Io_pilot 554 of FIG. 5 for circuit 602 operated as a test signal generator) based on the digital control signal 634. Signal 638 establishes the magnitude of the current to be added or subtracted from the signal 518'. Digital control signal 634 can be generated by a processor or controller, either internal or external with respect to the sensor.

In operation, the current Icomp or Io_pilot established by signal 638 flows through transistor 646a and is mirrored in transistors 646b, 646c, and 646d. The current through transistor 646d flows through series-coupled transistor 640a and is mirrored in transistors 640b, 640c.

A binary control signal 650 (here labeled "Sign") is configured to selectively enable or disable (i.e., connect or disconnect by control of switches 652-658) the current source elements 640b, 640c and the current sink elements 646b, 646c in order to thereby control the sign of the current (i.e., whether current is added to or subtracted from signal 518'). Inverters 660 can be coupled between the binary control signal 650 and switches 652, 654, 656, 658, as shown.

In the case of circuit 602 operated as an offset cancellation circuit, the binary control signal 650 can remain at a single logic level with which the offset cancellation current Icomp is added to or subtracted from signal 518'.

In the case of circuit 602 operated as a test signal generation circuit, binary control signal 650 can be modulated at the desired test signal frequency. In embodiments in which the sensor is chopped, the Sign signal 650 can be modulated at the desired test signal frequency and gated with the chopping signal (i.e., the digital square wave signal that controls the fchop inputs to the modulator 610 and demodulator 620).

Figure 6A:
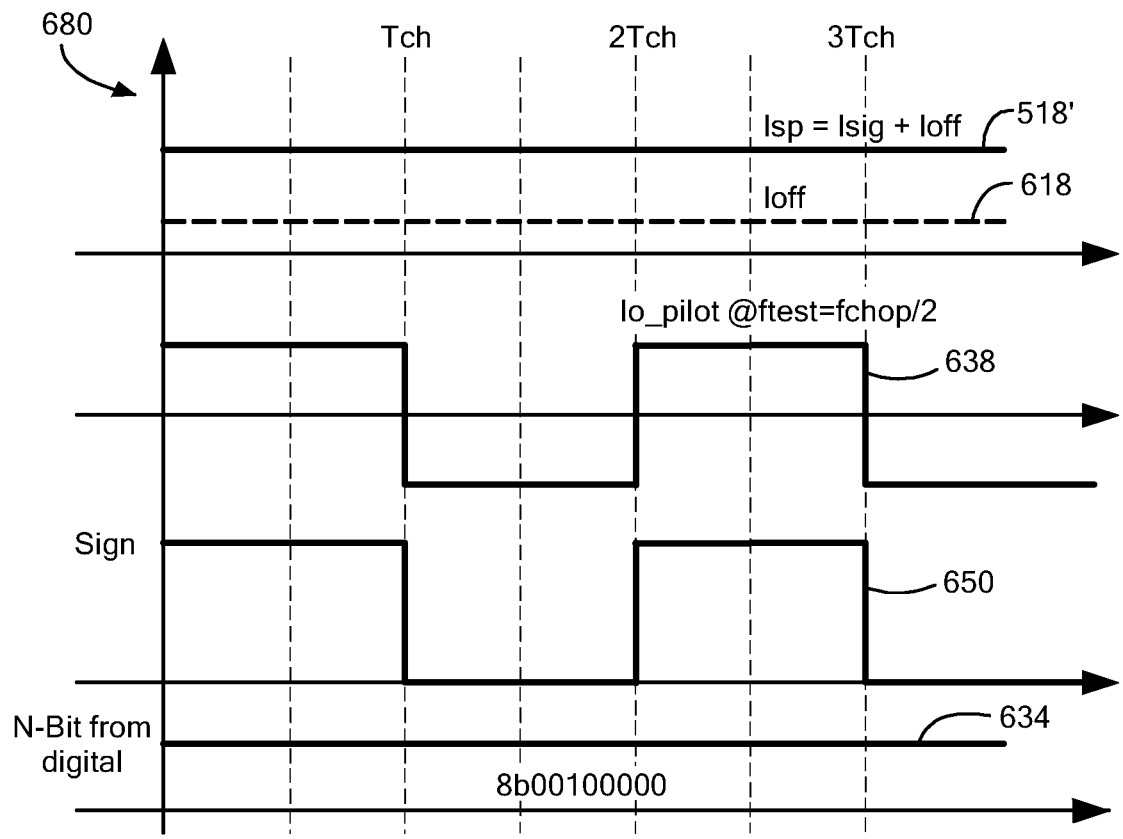
FIG. 6A includes example waveforms associated with use of the circuit of FIG. 6 as an offset cancellation circuit.

Referring to FIG. 6A, example waveforms 680 associated with operation of circuit 602 as a test signal generation circuit are shown. An example Isp signal 518' includes a main signal component Isig and an offset component Ioff, which offset component is also separately shown and labeled 618. An example digital control signal 634 is shown, in response to which DAC 630 (FIG. 6) generates the analog test current signal 638. The illustrated test signal frequency ftest can be one-half of the chopping frequency fchop. Also shown in the binary control signal Sign 650 with which switches 652, 654, 656, 658 (FIG. 6) are controlled. Here, the Sign signal 650 is modulated at the desired test signal frequency of fchop/2, as shown.

Figure 6B:
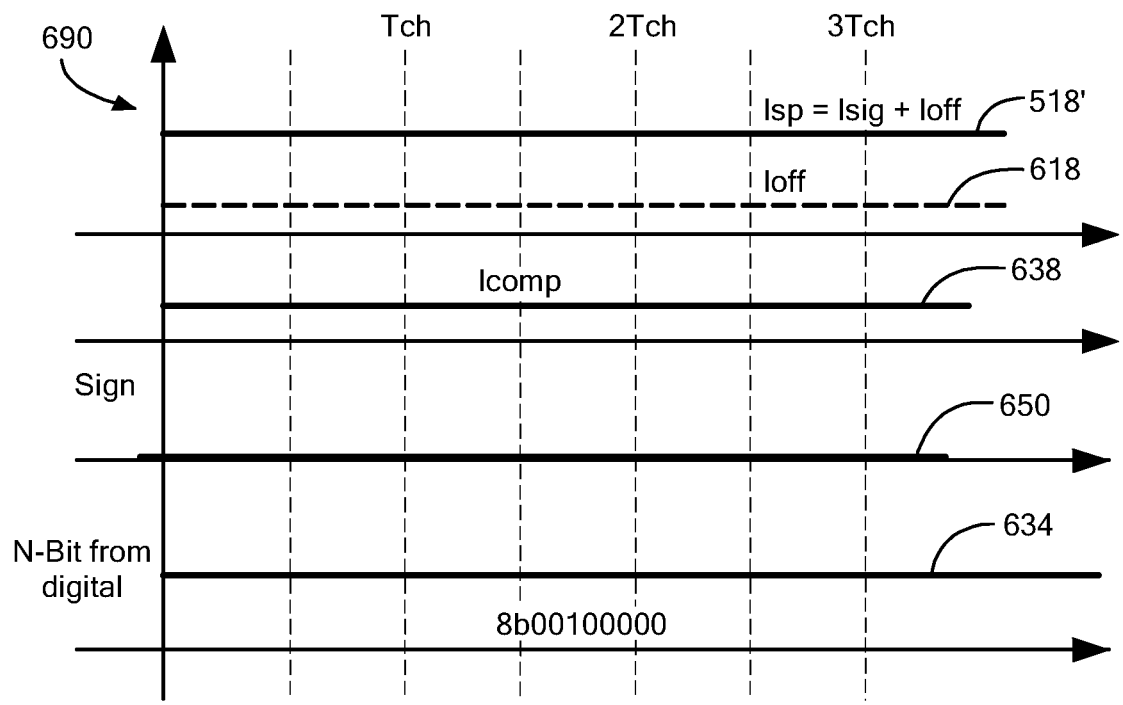
FIG. 6B includes example waveforms associated with use of the circuit of FIG. 6 as a test signal generation circuit.

Referring also to FIG. 6B, example waveforms 690 associated with operation of circuit 602 as an offset cancellation circuit are shown to include the same example Isp signal 518' as in FIG. 6A. In response to the example digital control signal 634, DAC 630 (FIG. 6) generates the Icomp signal 638. In order to control combination of the offset compensation current Icomp with the signal 518', the binary control signal Sign 650 is at a constant logic level in order to control switches 652, 654, 656, 658 (FIG. 6). For example, the illustrated logic low Sign signal 650 can cause the offset compensation current Icomp to be subtracted from signal 518' as will result in the offset component 618 being canceled from the signal as desired.

All references cited herein are hereby incorporated herein by reference in their entirety.

Having described preferred embodiments, it will now become apparent to one of ordinary skill in the art that other embodiments incorporating their concepts may be used.

For example, while the illustrated apparatus takes the form of magnetic field sensors 10, 400, 500, it will be appreciated by those of ordinary skill in the art that the diagnostics circuitry and methods described herein can be used on any type of integrated circuit or sensor or system requiring monitoring of one or more ADCs.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. Apparatus comprising:
   an ADC configured to convert a first analog signal to a digital signal;
   a digital-to-analog converter (DAC) configured to convert the digital signal to a second analog signal,
   a comparator having a first input responsive to the first analog signal, a second input responsive to the second analog signal, and an output at which a comparison signal is provided; and
   an output checker configured to process the comparison signal to generate a fault signal indicative of whether a fault has occurred in the ADC.

2. Apparatus comprising:
   a first ADC configured to convert an analog signal to a first digital signal;

a second ADC configured to convert the analog signal to a second digital signal;
a comparator having a first input responsive to the first digital signal, a second input responsive to the second digital signal, and an output at which a comparison signal is provided; and
an output checker configured to process the comparison signal to generate a fault indicative of whether a fault has occurred in the ADC.

3. Apparatus comprising:
a first ADC configured to convert a first analog signal to a first digital signal;
a second ADC configured to convert a second analog signal to a second digital signal;
an analog summation circuit responsive to the first analog signal and the second analog signal and configured to generate a first analog summation signal as a sum of the first analog signal and the second analog signal;
a digital summation circuit responsive to the first digital signal and the second digital signal and configured to generate a digital summation signal as a sum of the first digital signal and the second digital signal;
a digital-to-analog convertor (DAC) configured to convert the digital summation signal to a second analog summation signal; and
a comparator having a first input responsive to the first analog summation signal, a second input responsive to the second analog summation signal, and an output at which a comparison signal is provided.

4. The apparatus of claim 3, further comprising an output checker configured to process the comparison signal to generate a fault signal indicative of whether a fault has occurred in one or both of the first ADC or the second ADC.

5. The apparatus of claim 3, further comprising a margin unit configured to adjust one or both of the first analog summation signal and the second analog summation signal.

6. The apparatus of claim 3, wherein the digital summation signal comprises a first digital summation signal and the apparatus further comprises a third ADC configured to convert the analog summation signal to a second digital summation signal, wherein the comparator is a digital comparator responsive to the first digital summation signal at the first input and the second digital summation signal at the second input.

7. The apparatus of claim 6, further comprising a margin unit configured to adjust one or both of the first digital summation signal and the second digital summation signal.

8. The apparatus of claim 3, wherein the first ADC, the second ADC, the analog summation circuit, the digital summation circuit, and the comparator are part of a sensor configured to sense a parameter.

9. The apparatus of claim 8, wherein the sensor is a magnetic field sensor and further comprises a first magnetic field sensing element configured to generate the first analog signal and a second magnetic field sensing element configured to generate the second analog signal.

10. The apparatus of claim 9, further comprising a first front end amplifier coupled to receive an output signal of the first magnetic field sensing element and configured to generate the first analog signal and a second front end amplifier coupled to receive an output signal of the second magnetic field sensing element and configured to generate the second analog signal.

11. The apparatus of claim 10, wherein the first front end amplifier comprises a first output at which the first analog signal is provided and a second output at which a copy of the first analog output signal is provided, wherein the analog summation circuit is coupled to receive the copy of the first analog output signal and wherein the second front end amplifier comprises a first output at which the second analog signal is provided and a second output at which a copy of the second analog output signal is provided, wherein the analog summation circuit is coupled to receive the copy of the second analog output signal.

12. The apparatus of claim 10, wherein the first front end amplifier is a chopper amplifier and the second front end amplifier is a chopper amplifier.

13. The apparatus of claim 3, wherein each of the first ADC and the second ADC comprises a Continuous Time Sigma Delta Modulator (CTSDM).

14. A method comprising:
converting a first analog signal to a first digital signal with a first ADC;
converting a second analog signal to a second digital signal with a second ADC;
generating a first analog summation signal as a sum of the first analog signal and the second analog signal;
generating a digital summation signal as a sum of the first digital signal and the second digital signal;
converting the digital summation signal to a second analog summation signal; and
comparing a first signal based on the analog summation signal to a second signal based on the second analog summation signal to generate a comparison signal.

15. The method of claim 14, further comprising processing the comparison signal to determine whether a fault has occurred in one or both of the first ADC or the second ADC.

16. The method of claim 14, further comprising adjusting one or both of the first analog summation signal or the second analog summation signal before comparing.

17. The method of claim 14, wherein the digital summation signal comprises a first digital summation signal, the method further comprising converting the analog summation signal to a second digital summation signal and wherein comparing comprises comparing the first digital summation signal to the second digital summation signal.

18. The method of claim 17, further comprising adjusting one or both of the first digital summation signal and the second digital summation signal.

19. Apparatus comprising:
a sensing element configured to generate an analog input signal indicative of a parameter to be sensed;
an offset cancellation circuit coupled to receive the analog input signal and configured to remove an offset associated with the analog input signal;
a test circuit coupled to receive the analog input signal and configured to combine a test signal with the analog input signal to generate a combined signal, wherein the test circuit is substantially identical to the offset cancellation circuit;
an ADC having an input coupled to receive the combined signal and an output at which a digital signal is provided;
a recovery circuit configured to process the digital signal to recover the test signal; and
a checker circuit configured to determine if an error has occurred in the ADC based on the recovered test signal.

20. The apparatus of claim 19, wherein the recovery circuit comprises a bandpass filter.

21. The apparatus of claim 19, wherein the checker circuit comprises a comparator configured to compare the recovered test signal to a predetermined threshold.

22. The apparatus of claim 19, wherein each of the offset cancellation circuit and the test circuit comprises:

a DAC configured to receive a digital control signal;
at least one current source element controllable to add a current to the digital signal;
at least one current sink element controllable to subtract a current from the digital signal; and
a binary control signal configured to selectively enable or disable the at least one current source element and the at least one current sink element.

23. The apparatus of claim 22, further comprising a linearity checker circuit configured to adjust the digital control signal and compare the recovered test signal to an adjusted predetermined threshold.

24. The apparatus of claim 19, wherein the sensing element comprises a magnetic field sensing element.

25. The apparatus of claim 19, wherein the offset cancellation circuit is configured to remove the offset associated with the analog input signal during a first time period and wherein the test circuit is configured to combine the test signal with the analog input signal during a second time period that does not overlap with the first time period.

* * * * *

UNITED STATES PATENT AND TRADEMARK OFFICE
CERTIFICATE OF CORRECTION

PATENT NO. : 11,848,682 B2
APPLICATION NO. : 17/647639
DATED : December 19, 2023
INVENTOR(S) : Ezequiel Rubinsztain et al.

It is certified that error appears in the above-identified patent and that said Letters Patent is hereby corrected as shown below:

In the Specification

Column 1, Line 23 delete "or magnetic" and replace with --or more magnetic--.

Column 1, Line 62 delete "aspect" and replace with --aspects--.

Column 6, Line 53 delete "value above" and replace with --value being above--.

Column 8, Line 46 delete "(I2C)" and replace with --($I^2C$)--.

Column 10, Line 29 delete "based the" and replace with --based on the--.

Column 10, Line 64 delete "50 pec," and replace with --50 μsec,--.

Column 11, Line 1 delete "50 pec," and replace with --50 μsec,--.

Column 11, Line 10 delete "50 pec," and replace with --50 μsec,--.

Column 12, Line 26 delete "422a-422" and replace with --422a-422n--.

Column 13, Line 8 delete "(I2C)" and replace with --($I^2C$)--.

Column 15, Line 41 delete "(I2C)" and replace with --($I^2C$)--.

Column 17, Line 5 delete "operation" and replace with --operate--.

Column 18, Line 14 delete "shown in" and replace with --shown is--.

Signed and Sealed this
First Day of October, 2024

Katherine Kelly Vidal
*Director of the United States Patent and Trademark Office*